US012609675B2

(12) United States Patent
Yamazaki

(10) Patent No.: US 12,609,675 B2
(45) Date of Patent: Apr. 21, 2026

(54) ACOUSTIC WAVE DEVICE

(71) Applicant: Murata Manufacturing Co., Ltd., Nagaokakyo (JP)

(72) Inventor: Sunao Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 229 days.

(21) Appl. No.: 18/667,254

(22) Filed: May 17, 2024

(65) Prior Publication Data

US 2024/0305271 A1 Sep. 12, 2024

Related U.S. Application Data

(63) Continuation of application No. PCT/JP2022/041627, filed on Nov. 9, 2022.

(30) Foreign Application Priority Data

Dec. 1, 2021 (JP) ................................. 2021-195507

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/14541* (2013.01); *H03H 9/02952* (2013.01)

(58) Field of Classification Search
CPC .. H03H 9/02; H03H 9/05; H03H 9/10; H03H 9/125; H03H 9/25; H03H 9/64
See application file for complete search history.

(56) References Cited

U.S. PATENT DOCUMENTS 9,751,109 B2 * 9/2017 Moriya ................ H03H 9/1071
10,582,609 B2 * 3/2020 Yun .......................... H05K 3/32
(Continued)

FOREIGN PATENT DOCUMENTS

JP 2005198073 A 7/2005
JP 2007202130 A 8/2007
(Continued)

OTHER PUBLICATIONS

International Search Report in PCT/JP2022/041627, mailed Jan. 31, 2023, 3 pages.
(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device according to the present invention includes a piezoelectric substrate including a piezoelectric layer, a functional electrode provided on the piezoelectric layer, a first support layer provided on the piezoelectric substrate so as to surround the functional electrode, a covering portion provided on or above the first support layer and including a first main surface positioned on the functional electrode side and a second main surface opposite to the first main surface, a silicon oxide layer provided on the first main surface side of the covering portion, and an inductor provided on the silicon oxide layer and made of a wire. The covering portion is made of silicon. The acoustic wave device further includes one of an amorphous silicon layer and a polysilicon layer provided between the covering portion and the silicon oxide layer.

20 Claims, 4 Drawing Sheets

(56) References Cited

U.S. PATENT DOCUMENTS

| 11,171,096 | B2 * | 11/2021 | Park | H03H 9/1014 |
| 12,176,879 | B2 * | 12/2024 | Hatakeyama | H03H 9/1014 |
| 12,341,488 | B2 * | 6/2025 | Brunner | H03H 9/1014 |
| 2006/0022767 | A1 | 2/2006 | Taniguchi et al. | |
| 2007/0170565 | A1 | 7/2007 | Hong et al. | |
| 2017/0272051 | A1 | 9/2017 | Kurihara et al. | |
| 2022/0216844 | A1 | 7/2022 | Yamane et al. | |

FOREIGN PATENT DOCUMENTS

| JP | 2015156626 | A | 8/2015 |
| JP | 2017169139 | A | 9/2017 |
| WO | 2021060513 | A1 | 4/2021 |

OTHER PUBLICATIONS

Written Opinion in PCT/JP2022/041627, mailed Jan. 31, 2023, 3 pages.

* cited by examiner

ACOUSTIC WAVE DEVICE

CROSS REFERENCE TO RELATED APPLICATIONS

This application claims the benefit of priority to Japanese Patent Application No. 2021-195507, filed on Dec. 1, 2021, and is a Continuation Application of PCT Application No. PCT/JP2022/041627, filed on Nov. 9, 2022. The entire contents of each application are hereby incorporated herein by reference.

BACKGROUND OF THE INVENTION

1. Field of the Invention

The present invention relates to acoustic wave devices.

2. Description of the Related Art

Acoustic wave devices have been widely used for, for example, filters of cellular phones. Japanese Unexamined Patent Application Publication No. 2005-198073 discloses an example of a surface acoustic wave device. The surface acoustic wave device includes an insulator substrate formed by covering a silicon substrate with a silicon oxide film. A spiral inductor is provided on the insulator substrate. Thus, electrical isolation between the spiral inductor and the silicon substrate is provided.

However, in the insulator substrate described in Japanese Unexamined Patent Application Publication No. 2005-198073, a low-resistance portion may be formed on the interface between the silicon substrate and the silicon oxide film. In this case, capacitive coupling is likely to occur between the low-resistance portion and the spiral inductor. Consequently, insertion loss may be increased when such a surface acoustic wave device is used for a filter device.

SUMMARY OF THE INVENTION

Example embodiments of the present invention provide acoustic wave devices that are each able to reduce or prevent the capacitive coupling between an inductor and a portion to which the inductor is provided.

In an example embodiment of the present invention, an acoustic wave device includes a piezoelectric substrate including a piezoelectric layer, a functional electrode provided on the piezoelectric layer, a support layer provided on the piezoelectric substrate so as to surround the functional electrode, a covering portion provided on or above the support layer and including a first main surface positioned on the functional electrode side and a second main surface opposite to the first main surface, an inorganic oxide layer provided on the first main surface side of the covering portion, and an inductor provided on the inorganic oxide layer and made of a wire, in which the covering portion is made of silicon, and the acoustic wave device further includes one of an amorphous silicon layer and a polysilicon layer provided between the covering portion and the inorganic oxide layer.

In an example embodiment of the present invention, an acoustic wave device includes a piezoelectric substrate including a piezoelectric layer, a functional electrode provided on the piezoelectric layer, a support layer provided on the piezoelectric substrate so as to surround the functional electrode, a covering portion provided on or above the support layer and including a first main surface positioned on the functional electrode side and a second main surface opposite to the first main surface, an inorganic oxide layer provided on the first main surface side of the covering portion, and an inductor provided on the inorganic oxide layer and made of a wire, in which the covering portion is made of silicon, and the acoustic wave device further includes a silicon nitride layer provided between the covering portion and the inorganic oxide layer.

The acoustic wave devices according to example embodiments of the present invention are each able to reduce or prevent the capacitive coupling between the inductor and the portion to which the inductor is provided.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be disclosed through the description of specific example embodiments thereof, with reference to the drawings.

The example embodiments in the present description are examples, and partial replacement or combination of configurations is possible between different example embodiments.

Figure 1:
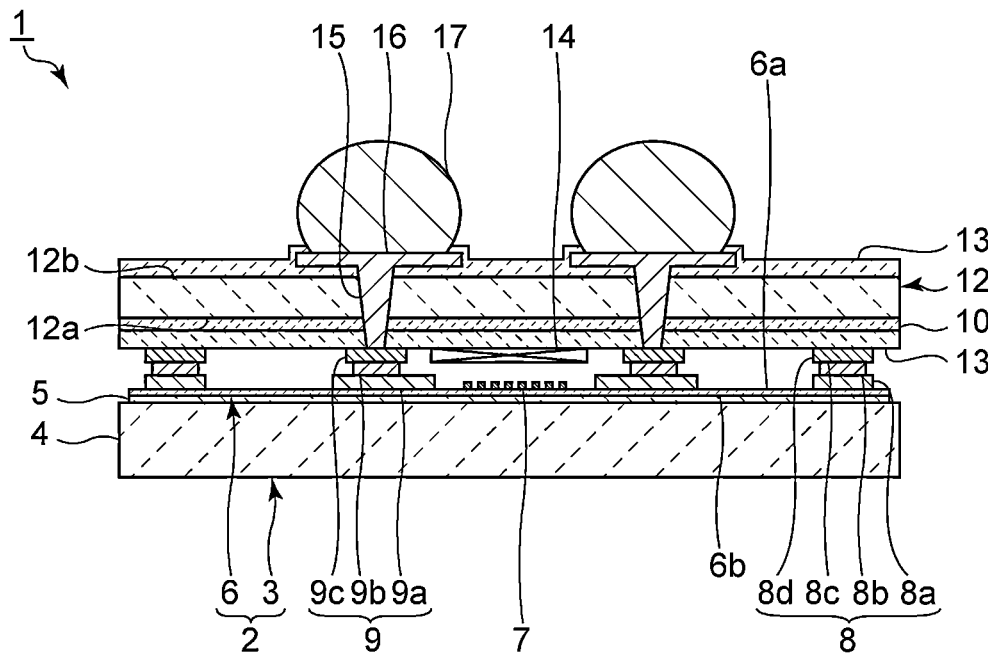
FIG. 1 is a simplified front sectional view of an acoustic wave device according to a first example embodiment of the present invention.

FIG. 1 is a simplified front sectional view of an acoustic wave device according to a first example embodiment of the present invention. In FIG. 1, an inductor, which will be described later, is simply represented by a rectangle with two diagonal lines.

An acoustic wave device 1 includes a piezoelectric substrate 2. The piezoelectric substrate 2 includes a support portion 3 and a piezoelectric layer 6. More specifically, the support portion 3 includes a support substrate 4 and an intermediate layer 5. The intermediate layer 5 is provided on the support substrate 4. The piezoelectric layer 6 is provided on the intermediate layer 5. The layer configuration of the piezoelectric substrate 2 is not limited to the above configuration. For example, the piezoelectric substrate 2 may be a substrate including only the piezoelectric layer 6.

An IDT (Interdigital Transducer) electrode 7 as a functional electrode is provided on the piezoelectric layer 6. An alternating voltage is applied to the IDT electrode 7, and an acoustic wave is thus excited. Moreover, a first support layer 8 and plural second support layers 9 are provided on the piezoelectric layer 6. The first support layer 8 corresponds to a support layer. The first support layer 8 and the plural second support layers 9 are each a multilayer body including plural metal layers. The first support layer 8 has a frame shape. On the other hand, each of the second support layers 9 has a columnar shape. The first support layer 8 is provided so as to surround the IDT electrode 7. More specifically, the first support layer 8 includes a cavity portion 8*d*. The IDT electrode 7 is positioned inside the cavity portion 8*d*.

The plural second support layers 9 are provided on the piezoelectric layer 6, specifically on a portion positioned inside the cavity portion 8*d* of the first support layer 8. A covering portion 12 is provided on or above the first support layer 8 and the plural second support layers 9 so as to cover the cavity portion 8*d*. The covering portion 12 is preferably made of silicon, for example. In the present description, the conditions where a member is made of a material include a case where impurities that are minute enough not to degrade the electrical characteristics of the acoustic wave device are included.

The covering portion 12 includes a first main surface 12*a* and a second main surface 12*b*. The first main surface 12*a* and the second main surface 12*b* are opposite to each other. Of the first main surface 12*a* and the second main surface 12*b*, the first main surface 12*a* is positioned on the IDT electrode 7 side. An amorphous silicon layer 10 is provided on the first main surface 12*a*. A silicon oxide layer 13 is provided on the amorphous silicon layer 10. More specifically, the silicon oxide layer 13 is, for example, a $SiO_2$ layer. The layer provided on the amorphous silicon layer 10 is not limited to the silicon oxide layer 13. An appropriate inorganic oxide layer may be provided on the amorphous silicon layer 10.

Figure 2:
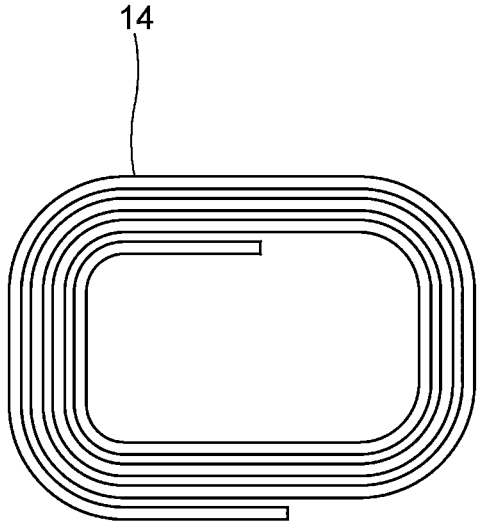
FIG. 2 is a plan view of an inductor according to the first example embodiment of the present invention.

An inductor 14 is provided on the silicon oxide layer 13. The inductor 14 is made of a wire. More specifically, as FIG. 2 illustrates, for example, the inductor 14 of the present example embodiment is preferably defined by a scroll wiring pattern. However, the shape of the wiring pattern is not limited to the above shape and may be, for example, a meandering shape.

The inductor 14 is electrically connected to the IDT electrode 7. More specifically, the inductor 14 is electrically connected to the second support layer 9 by using an electrode, which is not illustrated. On the other hand, the IDT electrode 7 is also electrically connected to the second support layer 9. Accordingly, the inductor 14 and the IDT electrode 7 are electrically connected to each other by using the second support layer 9. Although not illustrated, an insulating film may be provided so as to cover a portion of the wire defining the inductor 14. An electrode connected to an end portion of the inductor 14 positioned inside a wound section of the wire may be electrically insulated from the portion of the inductor 14 other than the end portion by using the insulating film.

The covering portion 12 includes plural through electrodes. More specifically, plural through holes are provided so as to each extend to the second support layer 9. A through electrode 15 is provided inside each of the plural through holes. One end of the through electrode 15 is connected to the second support layer 9. Plural electrode pads 16 are provided so as to each be connected to the other end of a corresponding one of the plural through electrodes 15. In the present example embodiment, the through electrode 15 and the electrode pad 16 are provided as one body. Plural bumps

17 are provided so as to be joined to the respective plural electrode pads 16. The IDT electrode 7 is electrically connected to the outside by using the second support layers 9, the through electrodes 15, the electrode pads 16, and the bumps 17.

A feature of the present example embodiment is that the silicon oxide layer 13 is provided on the first main surface 12*a* side of the covering portion 12, the inductor 14 is provided on the silicon oxide layer 13, and the amorphous silicon layer 10 is provided between the covering portion 12 and the silicon oxide layer 13. Accordingly, it is possible to reduce or prevent the capacitive coupling between the inductor 14 and the covering portion 12 for which the inductor 14 is provided. This reduction or prevention of the capacitive coupling therebetween will be described below.

Figure 3:
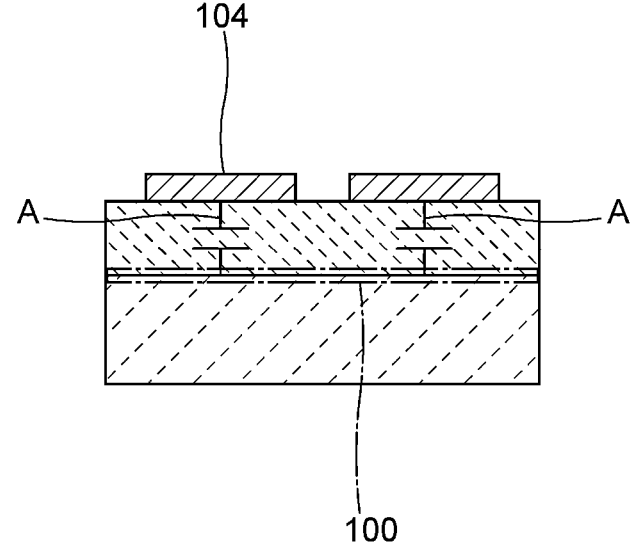
FIG. 3 is a schematic sectional view illustrating capacitive coupling.

In the case where a covering portion made by using silicon and a silicon oxide layer are laminated directly as in an existing configuration, electric carriers are generated, thus generating a low-resistance portion. In this case, as FIG. 3 schematically illustrates, capacitive coupling A may occur between an inductor 104 and a low-resistance portion 100.

In contrast, in the present example embodiment illustrated in FIG. 1, the amorphous silicon layer 10 is provided between the first main surface 12*a* of the covering portion 12 and the silicon oxide layer 13. The amorphous silicon layer 10 has a large band gap. Accordingly, even when electric carriers are generated, the amorphous silicon layer 10 can trap the carriers. Thus, a low-resistance portion can be reduced or prevented from being generated. Consequently, it is possible to reduce or prevent the capacitive coupling between the inductor 14 and the covering portion 12. Moreover, insertion loss can be reduced or prevented from increasing, when the acoustic wave device 1 is used for a filter device.

Hereinafter, the configuration of the present example embodiment will be further detailed.

Figure 4:
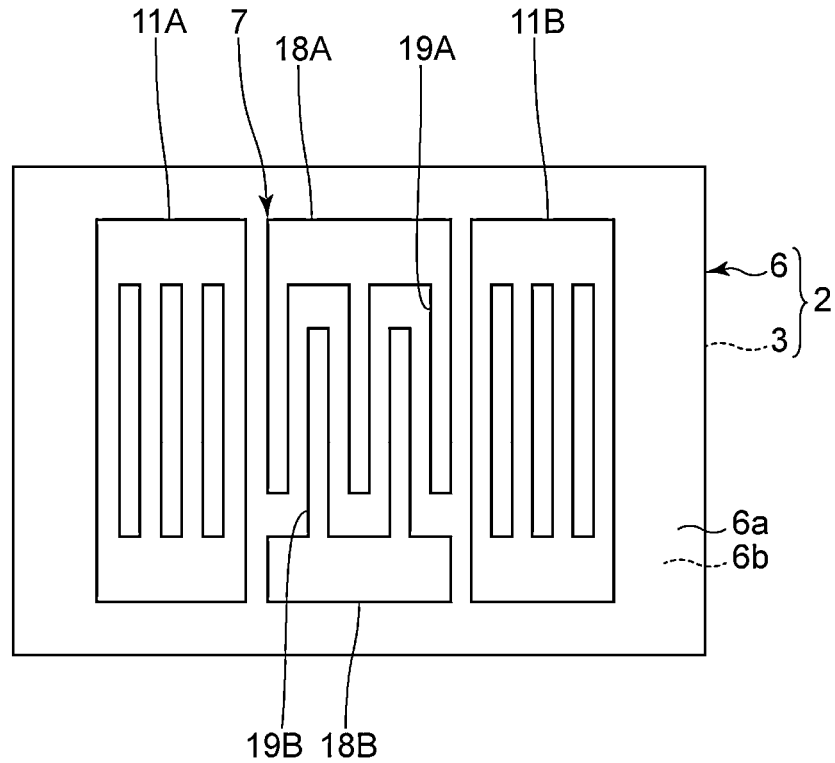
FIG. 4 is a plan view of the vicinity of an IDT electrode according to the first example embodiment of the present invention.

FIG. 4 is a plan view of the vicinity of the IDT electrode according to the first example embodiment. For example, a wire connected to the IDT electrode 7 is omitted form FIG. 4 for the sake of clarity.

The IDT electrode 7 includes a first busbar 18A, a second busbar 18B, plural first electrode fingers 19A, and plural second electrode fingers 19B. The first busbar 18A and the second busbar 18B face each other. One end of each of the plural first electrode fingers 19A is connected to the first busbar 18A. One end of each of the plural second electrode fingers 19B is connected to the second busbar 18B. The plural first electrode fingers 19A and the plural second electrode fingers 19B are interdigitated with one another. The direction where the plural first electrode fingers 19A and the plural second electrode fingers 19B extend is orthogonal or substantially orthogonal to an acoustic wave propagation direction in the present example embodiment.

The piezoelectric layer 6 includes a third main surface 6*a* and a fourth main surface 6*b*. The third main surface 6*a* and the fourth main surface 6*b* are opposite to each other. Of the third main surface 6*a* and the fourth main surface 6*b*, the third main surface 6*a* is positioned on the covering portion 12 side. The fourth main surface 6*b* is positioned on the support portion 3 side. The IDT electrode 7 is provided on the third main surface 6*a*.

A pair of reflectors 11A and 11B is provided on the third main surface 6*a* of the piezoelectric layer 6, specifically on both sides of the IDT electrode 7 in the acoustic wave propagation direction. As described above, the acoustic wave device 1 of the present example embodiment is, for example, a surface acoustic wave device. Each of the IDT electrode 7 and the reflectors 11A and 11B may include a single-layer metal film or may include a multilayer metal film.

A dielectric film may be provided on the piezoelectric layer 6 so as to cover the IDT electrode 7. Due to the dielectric film, the IDT electrode 7 is made more durable and is hardly ever broken. Through adjustment of the thickness of the dielectric film, a frequency of the acoustic wave device 1 can be easily adjusted. Examples of the material for the dielectric film include silicon oxide, silicon nitride, and silicon oxynitride.

As FIG. 1 illustrates, the first support layer 8 and the second support layer 9 are each a multilayer body including plural metal layers. More specifically, the first support layer 8 includes a first layer 8*a*, a second layer 8*b*, and a third layer 8*c*. The first layer 8*a*, the second layer 8*b*, and the third layer 8*c* are laminated in this order from the piezoelectric layer 6 side. The covering portion 12 is provided on or above the third layer 8*c*. Similarly, the second support layer 9 includes a first layer 9*a*, a second layer 9*b*, and a third layer 9*c*. The first layer 9*a*, the second layer 9*b*, and the third layer 9*c* are laminated in this order from the piezoelectric layer 6 side. The covering portion 12 is provided on or above the third layer 9*c*. However, the number of the layers of each of the first support layer 8 and the second support layer 9 is not limited to three.

The first support layer 8 and the second support layer 9 may be provided on a layer of the piezoelectric substrate 2 that is different from the piezoelectric layer 6. The first support layer 8 and the second support layer 9 may be provided on, for example, the intermediate layer 5 or the support substrate 4.

The intermediate layer 5 in the piezoelectric substrate 2 is made of an appropriate dielectric film. The intermediate layer 5 is not limited to such a single-layer dielectric film and may be a multilayer body including plural dielectric films.

A silicon oxide layer 13 is provided on the second main surface 12*b* of the covering portion 12. The above-described electrode pads 16 are provided in the silicon oxide layer 13. The bump 17 is joined to a portion of the corresponding electrode pad 16 exposed at the silicon oxide layer 13. The acoustic wave device 1 is joined to, for example, a mounting substrate by using the bumps 17. An inorganic oxide layer other than the silicon oxide layer 13 may be provided on the second main surface 12*b*.

Figure 5:
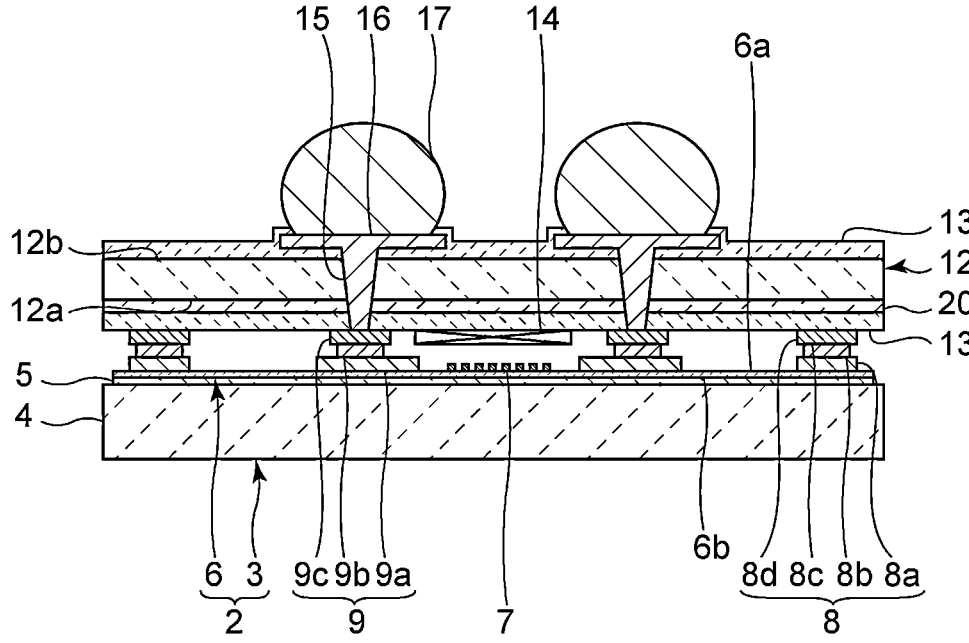
FIG. 5 is a simplified front sectional view of an acoustic wave device according to a second example embodiment of the present invention.

FIG. 5 is a simplified front sectional view of an acoustic wave device according to a second example embodiment of the present invention.

The present example embodiment differs from the first example embodiment in that a polysilicon layer 20 is provided between the first main surface 12*a* of the covering portion 12 and the silicon oxide layer 13. Except for the above point, the acoustic wave device of the present example embodiment has a configuration the same as or similar to that of the acoustic wave device 1 of the first example embodiment.

As with the amorphous silicon layer 10 in the first example embodiment, the polysilicon layer 20 has a large band gap. Accordingly, even when electric carriers are generated, the polysilicon layer 20 can trap the carriers. Thus, a low-resistance portion can be reduced or prevented from being generated. Consequently, it is possible to reduce or prevent the capacitive coupling between the inductor 14 and the covering portion 12.

As described above, the above-described capacitive coupling can be reduced or prevented by providing one of the amorphous silicon layer 10 and the polysilicon layer 20 between the first main surface 12*a* of the covering portion 12 and the silicon oxide layer 13.

Figure 6:
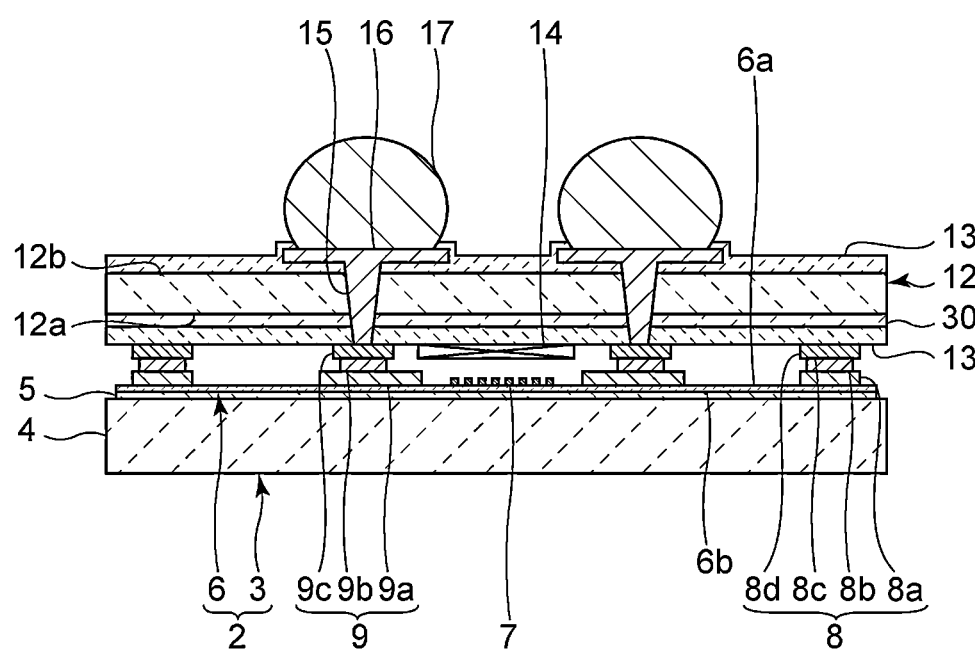
FIG. 6 is a simplified front sectional view of an acoustic wave device according to a third example embodiment of the present invention.

FIG. 6 is a simplified front sectional view of an acoustic wave device according to a third example embodiment of the present invention.

The present example embodiment differs from the first example embodiment in that a silicon nitride layer 30 such as a SiN layer is provided between the first main surface 12*a* of the covering portion 12 and the silicon oxide layer 13. Except for the above point, the acoustic wave device of the present example embodiment has a configuration the same as or similar to that of the acoustic wave device 1 of the first example embodiment.

The covering portion 12 is not in direct contact with the silicon oxide layer 13 due to the provided silicon nitride layer 30. Accordingly, electric carriers can be reduced or prevented from being generated. Thus, a low-resistance portion can be reduced or prevented from being generated. Consequently, it is possible to reduce or prevent the capacitive coupling between the inductor 14 and the covering portion 12.

An example where the functional electrode is the IDT electrode 7 is described in the first to third example embodiments. However, the functional electrode is not limited to the IDT electrode 7. Hereinafter, an example where the acoustic wave device is a BAW (Bulk (Acoustic Wave) element will be described.

Figure 7:
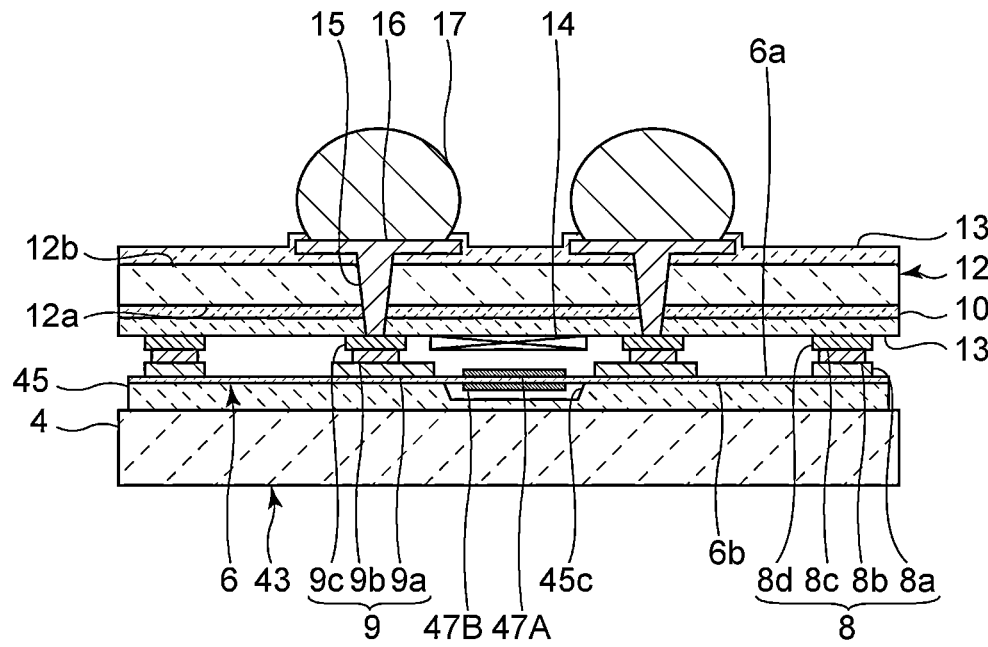
FIG. 7 is a simplified front sectional view of an acoustic wave device according to a fourth example embodiment of the present invention.

FIG. 7 is a simplified front sectional view of an acoustic wave device according to a fourth example embodiment of the present invention.

The present example embodiment differs from the first example embodiment in that the functional electrode includes a first electrode 47A and a second electrode 47B. The present example embodiment also differs from the first example embodiment in that a hollow portion is provided in a support portion 43. Except for the above points, the acoustic wave device of the present example embodiment has a configuration the same as or similar to that of the acoustic wave device 1 of the first example embodiment.

A recessed portion 45*c* is provided in an intermediate layer 45 of the support portion 43. The piezoelectric layer 6 is provided so as to cover the recessed portion 45*c*. Thus, the hollow portion is provided in the intermediate layer 45. The hollow portion is surrounded by the intermediate layer 45 and the piezoelectric layer 6.

At least a portion of the hollow portion may be provided in the support substrate 4. In this case, for example, a recessed portion or a through hole may be provided in the support substrate 4. The recessed portion or the through hole may be covered with the intermediate layer 45. A through hole may be formed in the intermediate layer 45 so as to be connected to the recessed portion or the through hole of the support substrate 4. In this case, the through hole of the intermediate layer 45 may be covered with the piezoelectric layer 6.

The first electrode 47A is provided on the third main surface 6*a* of the piezoelectric layer 6. The second electrode 47B is provided on the fourth main surface 6*b*. The second electrode 47B is positioned inside the hollow portion of the support portion 43. The first electrode 47A and the second electrode 47B are opposite to each other across the piezoelectric layer 6. A region where the first electrode 47A and the second electrode 47B are opposite to each other is an excitation region. An acoustic wave is excited in the excitation region. The excitation region and the hollow portion overlap each other in a plan view. More specifically, in the present example embodiment, the entire excitation region lies within the hollow portion in the plan view. The expression "in a plan view" in the present description means being viewed from the upper side in FIG. 7 and other figures. In FIG. 7, for example, of the piezoelectric layer 6 side and the support substrate 4 side, the piezoelectric layer 6 side is the upper side.

In the present example embodiment, as with the first example embodiment, the amorphous silicon layer 10 is also provided between the first main surface 12a of the covering portion 12 and the silicon oxide layer 13. Accordingly, the capacitive coupling between the inductor 14 and the covering portion 12 can be reduced or prevented.

In the case where the acoustic wave device is a BAW element, the polysilicon layer 20 illustrated in FIG. 5 or the silicon nitride layer 30 in FIG. 6 may also be provided between the first main surface 12a of the covering portion 12 and the silicon oxide layer 13. In the above cases, the capacitive coupling between the inductor 14 and the covering portion 12 can also be reduced or prevented.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including a piezoelectric layer;
a functional electrode provided on the piezoelectric layer;
a support layer provided on the piezoelectric substrate so as to surround the functional electrode;
a covering portion provided on or above the support layer and including a first main surface positioned on the functional electrode side and a second main surface opposite to the first main surface;
an inorganic oxide layer provided on the first main surface side of the covering portion; and
an inductor provided on the inorganic oxide layer and made of a wire; wherein
the covering portion is made of silicon; and
the acoustic wave device further includes one of an amorphous silicon layer and a polysilicon layer provided between the covering portion and the inorganic oxide layer.

2. The acoustic wave device according to claim 1, wherein the inorganic oxide layer is a silicon oxide layer.

3. The acoustic wave device according to claim 1, wherein the functional electrode is an interdigital transducer electrode.

4. The acoustic wave device according to claim 1, wherein
the piezoelectric substrate includes a support portion including a support substrate, and the piezoelectric layer is provided on the support portion;
a hollow portion is provided in the support portion;
the piezoelectric layer includes a third main surface and a fourth main surface;
the functional electrode includes a first electrode provided on the third main surface of the piezoelectric layer and a second electrode provided on the fourth main surface of the piezoelectric layer;
an excitation region where the first electrode and the second electrode are opposite to each other across the piezoelectric layer is provided; and
the excitation region and the hollow portion overlap each other in a plan view.

5. The acoustic wave device according to claim 4, wherein an intermediate layer is provided between the piezoelectric substrate and the support portion.

6. The acoustic wave device according to claim 4, wherein the support layer has a frame shape and includes a cavity portion; and the covering portion is located above the support layer to cover the cavity portion.

7. The acoustic wave device according to claim 4, further comprising a pair of reflectors provided on the third main surface of the piezoelectric layer.

8. The acoustic wave device according to claim 1, wherein the covering portion includes a plurality of through holes which permit through electrodes to pass through the covering portion.

9. The acoustic wave device according to claim 8, wherein electrode pads are connected to the through electrodes which pass through the covering portion.

10. The acoustic wave device according to claim 1, wherein the functional electrode is an interdigital transducer electrode which includes a first busbar, a second busbar, plural first electrode fingers, and plural second electrode fingers with the first busbar and the second busbar opposing each other.

11. An acoustic wave device comprising:
a piezoelectric substrate including a piezoelectric layer;
a functional electrode provided on the piezoelectric layer;
a support layer provided on the piezoelectric substrate so as to surround the functional electrode;
a covering portion provided on or above the support layer and including a first main surface positioned on the functional electrode side and a second main surface opposite to the first main surface;
an inorganic oxide layer provided on the first main surface side of the covering portion; and
an inductor provided on the inorganic oxide layer and made of a wire; wherein
the covering portion is made of silicon; and
the acoustic wave device further includes a silicon nitride layer provided between the covering portion and the inorganic oxide layer.

12. The acoustic wave device according to claim 11, wherein the inorganic oxide layer is a silicon oxide layer.

13. The acoustic wave device according to claim 11, wherein the functional electrode is an interdigital transducer electrode.

14. The acoustic wave device according to claim 11, wherein
the piezoelectric substrate includes a support portion including a support substrate, and the piezoelectric layer is provided on the support portion;
a hollow portion is provided in the support portion;
the piezoelectric layer includes a third main surface and a fourth main surface;
the functional electrode includes a first electrode provided on the third main surface of the piezoelectric layer and a second electrode provided on the fourth main surface of the piezoelectric layer;
an excitation region where the first electrode and the second electrode are opposite to each other across the piezoelectric layer is provided; and
the excitation region and the hollow portion overlap each other in a plan view.

15. The acoustic wave device according to claim 14, wherein
an intermediate layer is provided between the piezoelectric substrate and the support portion.

16. The acoustic wave device according to claim 14, wherein the support layer has a frame shape and includes a cavity portion; and the covering portion is located above the support layer to cover the cavity portion.

17. The acoustic wave device according to claim 11, wherein the covering portion includes a plurality of through holes which permit through electrodes to pass through the covering portion.

18. The acoustic wave device according to claim 17, wherein electrode pads are connected to the through electrodes which pass through the covering portion.

19. The acoustic wave device according to claim 18, further comprising a pair of reflectors provided on the third main surface of the piezoelectric layer.

20. The acoustic wave device according to claim 11, wherein the functional electrode is an interdigital transducer electrode which includes a first busbar, a second busbar, plural first electrode fingers, and plural second electrode fingers with the first busbar and the second busbar opposing each other.

* * * * *